(12) United States Patent
Klose et al.

(10) Patent No.: US 7,951,635 B2
(45) Date of Patent: May 31, 2011

(54) METHOD FOR THE COMPENSATION OF DEVIATIONS OCCURRING AS A RESULT OF MANUFACTURE IN THE MANUFACTURE OF MICROMECHANICAL ELEMENTS AND THEIR USE

(75) Inventors: Thomas Klose, Dresden (DE); Harald Schenk, Dresden (DE); Alexander Wolter, Dresden (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 474 days.

(21) Appl. No.: 11/850,168

(22) Filed: Sep. 5, 2007

(65) Prior Publication Data
US 2008/0081392 A1    Apr. 3, 2008

(30) Foreign Application Priority Data
Sep. 8, 2006    (DE) .......................... 10 2006 043 388

(51) Int. Cl.
H01L 21/00    (2006.01)
(52) U.S. Cl. ......................................................... 438/50
(58) Field of Classification Search .............. 438/50–53; 216/2
See application file for complete search history.

(56) References Cited

U.S. PATENT DOCUMENTS
2005/0184351 A1 * 8/2005 Fu ................................. 257/415

FOREIGN PATENT DOCUMENTS
DE    691 26 381 T2    9/1997
DE    198 19 458 A1    11/1999
DE    101 39 443 A1    3/2003

* cited by examiner

*Primary Examiner* — Evan Pert
(74) *Attorney, Agent, or Firm* — Barnes & Thornburg LLP

(57) ABSTRACT

The invention relates to a method for the compensation of deviations occurring as a result of manufacture in the manufacture of micromechanical elements and their use which should be deflected at a resonant frequency. It is therefore the object of the invention to compensate deviations which occur due to manufacture and which have an influence on the resonant frequency of micromechanical elements in a simple and cost-effective manner. In accordance with the invention, a procedure is followed such that additional trenches and/or recesses are formed at the deflectable element simultaneously with the forming of the trenches by dry etching with which at least one spring element, a deflectable element and optionally also a frame element of micromechanical elements are formed. The trenches and recesses can thereby be formed under the same respective process parameters at the respective micromechanical element or at all micromechanical elements of a batch. A removal of material during etching, preferably dry etching, therefore takes place under the same etching conditions so that the respectively removed mass at trenches and/or recesses is influenced in the same manner by the etching process parameters.

9 Claims, 1 Drawing Sheet

Figure 1:
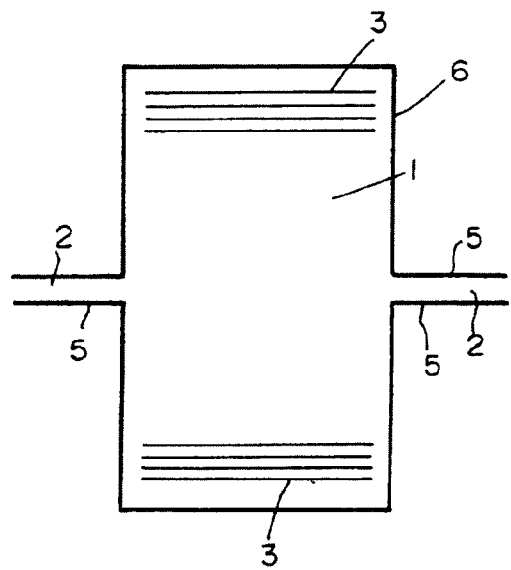

METHOD FOR THE COMPENSATION OF DEVIATIONS OCCURRING AS A RESULT OF MANUFACTURE IN THE MANUFACTURE OF MICROMECHANICAL ELEMENTS AND THEIR USE

The invention relates to a method for the compensation of deviations occurring as a result of manufacture in the manufacture of micromechanical elements and their use which should be deflected at a resonant frequency. It can be a case of different applications such as may, for example, be reflecting elements which can be used for the direct deflection of electromagnetic radiation. The respective oscillating deflection movement can be translatory, but also a pivoting around a torsion axis.

With such micromechanical elements, slight deviations occurring due to manufacture from specifications in spring elements with which deflectable elements of micromechanical elements are held have a substantial effect on the respective natural frequency. In the operation of such micromechanical elements, the observation of a specific predetermined frequency for operation and also in use is of importance. This is inter alia of importance in scanner mirrors for a projection of data since data frequencies and oscillation frequencies have to be in a specific relationship with one another. It is also of importance with clock generators.

Micromechanical elements should frequently also be operated parallel and synchronously with one another so that a specific frequency specification also has to be taken into account.

In addition, the power required for a deflection is considerably reduced in an operation in the resonant range. The individual elements are thus less strained due to the required lower electrical voltage and/or electrical current and operating stability is higher.

A procedure has previously been followed in the manufacture of the micromechanical elements in question such that the individual parts are formed from a substrate by dry etching methods. In this connection, trenches in a structured shape are formed starting from a surface of a substrate which can, for example, be a silicon wafer. These trenches then form spring elements for one respective micromechanical element of which a plurality can be formed on the substrate and in each case one deflectable element which is held at a frame element by means of spring elements.

As a result of the material removal during etching, the dimension and the geometrical design of the trenches and accordingly also of the elements of a micromechanical element are also influenced. Deviations in the process control result in changes in the micromechanical elements formed. An increased or reduced material removal can thus result in wider or also narrower trenches. The limited homogeneity of masks, the respective etching rate and also an underetching have an effect.

This in particular influences the spring constant of spring elements, which is in turn expressed in a change in the natural resonant frequency of the spring-mass system.

The frequency range in which a micromechanical element can be operated under resonant conditions is, however, very small so that even very small deviations in the process control result in an unwanted shift in the natural resonant frequency.

Resonant frequency deviations can occur in micromechanical elements which are basically structurally identical as a consequence of statistical and systematic deviations caused by manufacture in the dimensioning, in the geometrical design as well as in the mass of elements of the micromechanical elements.

In this connection, in particular systematically induced deviations on spring elements have a large influence on the respective resonant frequency. They are influenced to a substantial degree by the manufacturing process. The masks used and the process parameters in dry etching have an influence in this connection.

It is possible to distinguish between global, local and direction-dependent fluctuations of the process.

Global fluctuations have an effect on all micromechanical elements to be manufactured together and simultaneously. This can, for example, be a correspondingly varied pressure of the etching gas used.

Local fluctuations influence the manufactured mechanical elements at specific locations. This can occur as a consequence of location-dependent fluctuations in the concentration of an etching gas in the respective process chamber.

Direction-dependent fluctuations influence the micromechanical elements in accordance with their orientation within a process chamber or in their alignment to the center of the process chamber.

Different measures have previously been proposed to compensate such deviations. It is thus known from WO 2004/092745 A1 to vary a deviating spring behavior in that a plurality of slits are formed on spring elements. The spring constant of the respective spring element can then be irreversibly varied in stepped form by a separating of webs between slits. It is moreover suggested there also to carry out electrical compensation with additional electrostatic forces. This is associated with an increased effort for production and operation.

It is proposed in U.S. Pat. Nos. 6,331,909 and 6,285,489 to adapt the ambient pressure and thereby the effective mass. In this process, the deflectable element should be charged with a gas. The apparatus effort and the effort for the feedback control in operation are, however, substantial. In a further alternative, it is also proposed there for spring elements to contain a gas-absorbing component. The spring element material and accordingly also the resonant frequency varies due to absorption. A substantial effort is also required for this.

A lateral displacement of elements pivotable around an axis of rotation by electrostatic forces is proposed in U.S. Pat. Nos. 6,256,131 and 6,285,489. An only very small influence can be made on the variation of the resonant frequency by the inertia varied in this manner.

Since the known measures have deficits, however, a selection is usually carried out and micromechanical elements are sorted out whose deviation is too large. This naturally has a disadvantageous effect on the achievable yield and on the manufacturing costs.

It is therefore the object of the invention to compensate deviations which occur due to manufacture and which have an influence on the resonant frequency of micromechanical elements in a simple and cost-effective manner.

In accordance with the invention, a procedure is followed such that additional trenches and/or recesses are formed at the deflectable element simultaneously with the forming of the trenches by dry etching with which at least one spring element, a deflectable element and optionally also a frame element of micromechanical elements are formed. The trenches and recesses can thereby be formed under the same respective process parameters at the respective micromechanical element or at all micromechanical elements. A removal of material during etching, preferably dry etching, therefore takes place under the same etching conditions so that the respectively removed mass at trenches and/or recesses is influenced in the same manner by the etching process parameters.

It can be taken into account in this process that the resonant frequency f of a spring-mass system, as is also represented by a micromechanical element to be manufactured in accordance with the invention, is directly proportional to the spring constant k and indirectly proportional to the mass m or the inertia J with a linear spring characteristic.

The following apply:
$f^2 \sim k/m$ and $f^2 \sim k/J$

The mass and/or the inertia of deflectable elements should likewise be varied for a compensation of a spring constant of spring elements which is varied from a specification and which can occur, as already stated in the introduction, due to manufacture due to possible different gap dimensions of trenches with which spring elements should be formed. This should, however, take place in a respectively different direction, that is with thinner/narrower spring elements, a lower inertia results and with wider spring elements a higher inertia.

In this connection, the geometrical design of deflectable elements as well as the design and arrangement of additional trenches and/or recesses at deflectable elements can likewise have a positive influence on an observation of a predetermined resonant frequency.

The mass and/or the mass moment of inertia of deflectable elements of micromechanical elements can be adapted to a respective deviation of the spring constant TKL of spring elements and also to a resonant frequency using the additional trenches and/or recesses.

Additional trenches and/or recesses can be made such that they either completely pass through the thickness of the deflectable element or that they are not guided through the total deflectable element so that they can be formed at one side as open trenches or like blind holes. The latter increases the strength of the deflectable elements. The respective depth of such additional trenches or recesses can likewise have an effect on the changed mass or mass moment of inertia.

Micromechanical elements whose deflectable elements oscillate in a translatory manner or also those in which the respective deflectable elements can be pivoted in an oscillating manner around an axis of rotation can be manufactured. In the latter case, the spring elements are made as torsion spring elements.

The etching gases usually used can be worked with in the invention. No additional effort is required beyond the use of correspondingly changed masks or of a correspondingly matched structuring for the formation of additional trenches and/or recesses.

The elements in accordance with the invention can be used for microscopy, beam path manipulation, path length modulation, in scanners (two-dimensional and three-dimensional), microscopes, spectrometers, Fourier spectrometers, laser displays, laser printers, accelerometers, gyroscopes, signaling device transducers, clock generators or laser typesetters.

The invention should be explained in more detail in the following with reference to examples.

Figure 2:
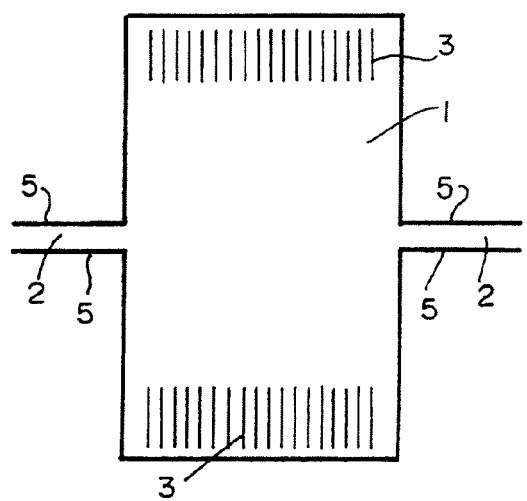
Figure 3:
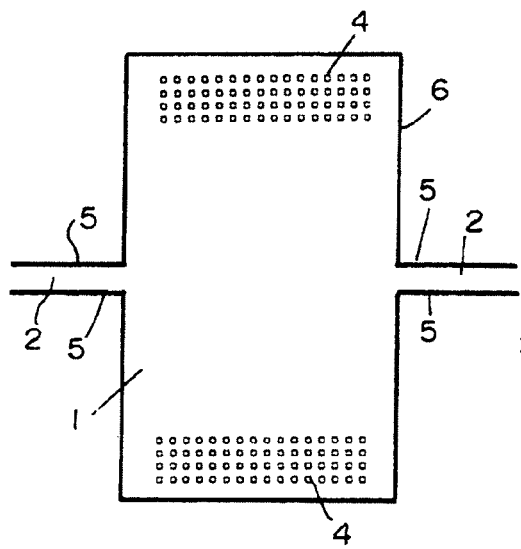
Figure 4:
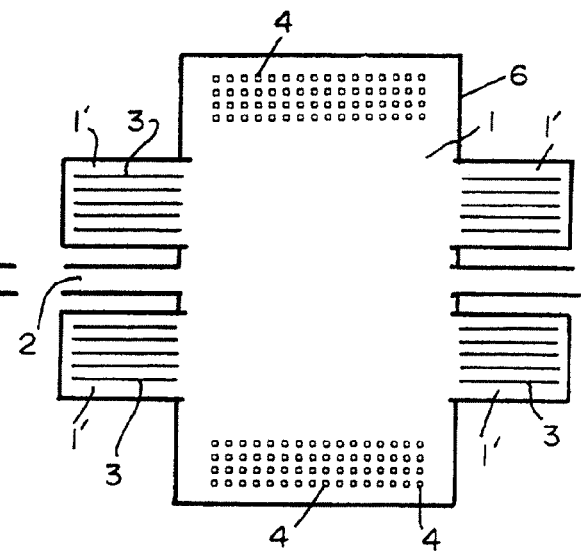

There are shown:

FIG. 1: an example of a micromechanical element which can be manufactured with the invention;

FIG. 2: a further example of a micromechanical element which can be manufactured in accordance with the invention with additional trenches;

FIG. 3: a further example of a micromechanical element which can be manufactured in accordance with the invention with additional recesses; and FIG. 4: a further example of a micromechanical element which can be manufactured in accordance with the invention with additional recesses as well as additional trenches at projecting marginal regions of a deflectable element.

An example of a micromechanical element is shown in FIG. 1 which can be manufactured in accordance with the invention. Trenches 5 and 6 can be etched into a substrate, which can be made e.g. from silicon alone or together with polysilicon, by a dry etching process with correspondingly contoured masks. The trenches 5 form spring elements 2 with which the respective deflectable element 1 is held at a frame element now shown here. The peripheral trench 6 separates the deflectable element 1 from the frame element.

At the same time, that is with the same process conditions, additional trenches 3 are formed in the deflectable element 1 which are here aligned parallel to a longitudinal axis or also a rotational axis of spring elements 2.

The additional trenches 3 should be made arranged as symmetrically as possible to the longitudinal axis or also the rotational axis of the spring elements 2, which should also apply to recesses 4.

They should also be arranged at an outer marginal region with a space from the longitudinal axis or rotational axis of the spring elements 2 which is as large as possible.

Fluctuations which occur due to production, such as in particular widths of trenches 5 with corresponding gap dimensions and gap geometries differing from specifications result in an influencing of the spring geometry, its dimensioning and accordingly also its spring characteristic which in turn influences the resonant frequency.

This can, however, be compensated by the simultaneous formation of additional trenches 3, 3' and/or recesses 4 and a corresponding change of mass and/or mass moment of inertia of the deflectable element 1 to observe the desired range of the resonant frequency.

Deviating process parameters act simultaneously and at least global deviations of a process can be compensated without additional measures having to be carried out or performed subsequently.

It is thus, for example, the case that in the event of trenches 5 etched too wide with narrower spring elements 2 and their smaller spring constant at the respective deflectable element 1 mass and/or mass moment of inertia likewise also becomes/become smaller without additional process steps or subsequent compensation means and the predetermined resonant frequency can thereby be observed.

In the example shown in FIG. 2, strip-shaped additional trenches 3 were likewise formed at a deflectable element 1. They were, however, aligned parallel to one another, but perpendicular to the longitudinal axis or rotational axis of the spring elements 2. They are also arranged here at an outer marginal region and at a distance from the axis of the spring elements 2 which is as large as possible, which in particular has an advantageous effect for the desired compensation effect with deflectable elements 1 pivotable around the axis of rotation of spring elements 2.

Examples are shown in FIGS. 3 and 4 in which additional recesses 4 have been formed. They can be formed, as also the additional trenches 3, with respect to their number, dimensioning (cross-section and depth) as well as their arrangement adapted to the desired compensation while taking account of the respective deflectable elements 1. The outer marginal geometry of the respective deflectable elements 1 can be taken into account in this connection. Accordingly, additional trenches 3 can also be made curved in arcuate form or a plurality of recesses 4 can be arranged following such an arc.

The additional recesses 4 here have square cross-sections, whereby the useful length of a trench rim which can be displaced is larger per surface unit than with strip-shaped trenches 3.

In the example shown in FIG. 4, trenches 6 were formed such that projecting marginal regions 1' are present on the deflectable element 1. The projecting marginal regions 1' are arranged as close as possible to the spring elements 2. Additional trenches 3' were again formed at the projecting marginal regions 1'. Corresponding row arrangements of additional recesses (not shown) could, however, also be formed.

Local process fluctuations, and in particular also process fluctuations dependent on direction can be compensated even better by the parallel alignment and the close position to the spring elements 2.

The invention claimed is:

1. A method for the compensation of deviations occurring due to manufacture in the manufacture of deflectable micromechanical elements, each deflectable micromechanical element having a resonant frequency, each deflectable micromechanical element being suspended from a surrounding frame by at least one spring element, said method comprising etching to manufacture the at least one spring element and the deflectable element from a substrate, with trenches being formed in the substrate by etching and simultaneously at least one of additional trenches and recesses with said at least one of additional trenches and recesses likewise being formed by etching in the deflectable element, wherein at least one of the mass and the inertia of the deflectable element is adapted to the spring constant of the at least one spring element and to a resonant frequency with the formation of said at least one of additional trenches and recesses.

2. A method in accordance with claim 1 wherein said at least one of additional trenches and recesses are formed by dry etching.

3. A method in accordance with claim 1 wherein said at least one spring element, the deflectable element and said at least one of additional trenches and recesses are formed simultaneously.

4. A method in accordance with claim 1 wherein said at least one of additional trenches and recesses are formed at an outer marginal region of a deflectable element.

5. A method in accordance with claim 1 wherein said additional trenches are formed in the form of the outer marginal geometry of the deflectable element.

6. A method in accordance with claim 1 wherein said additional trenches and recesses are formed symmetrically to the longitudinal axis and the torsional axis of said spring elements.

7. A method in accordance with claim 1 wherein said additional trenches and a row arrangement of recesses are formed parallel to the longitudinal axis and torsional axis of said spring elements.

8. A method in accordance with claim 7 wherein said additional trenches and a row arrangement of recesses are formed in marginal regions of the deflectable element which are projecting at spring elements.

9. A method of doing at least one of:
making a microscope; manipulating a beam path; modulating a beam path length; making a scanner; making a spectroscope; making a laser display; making a laser printer; making a laser typesetter; and, making a Fourier spectrometer by compensating for deviations occurring due to manufacture in the manufacture of micromechanical elements which are to be deflected at a resonant frequency and are held with at least one spring element at a frame element, said method comprising etching to manufacture the at least one spring element and the deflectable element from a substrate, with trenches being formed in the substrate by etching and simultaneously at least one of additional trenches and recesses with said at least one of additional trenches and recesses likewise being formed by etching in the deflectable element, wherein at least one of the mass and the inertia of the deflectable element is adapted to the spring constant of the at least one spring element and to a resonant frequency with the formation of said at least one of additional trenches and recesses.

* * * * *